(12) United States Patent
Shedletsky et al.

(10) Patent No.: US 8,896,995 B2
(45) Date of Patent: Nov. 25, 2014

(54) SHOCK MOUNTING COVER GLASS IN CONSUMER ELECTRONIC DEVICES

(71) Applicant: Apple Inc., Cupertino, CA (US)

(72) Inventors: Anna-Katrina Shedletsky, Sunnyvale, CA (US); Fletcher R. Rothkopf, Los Altos, CA (US); Adam Mittleman, Portola Valley, CA (US); Stephen Brian Lynch, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 203 days.

(21) Appl. No.: 13/670,289

(22) Filed: Nov. 6, 2012

(65) Prior Publication Data

US 2013/0063885 A1    Mar. 14, 2013

Related U.S. Application Data

(63) Continuation of application No. 12/780,715, filed on May 14, 2010, now Pat. No. 8,305,744.

(51) Int. Cl.
| | |
|---|---|
| *G06F 1/16* | (2006.01) |
| *F16F 7/108* | (2006.01) |
| *F16F 7/10* | (2006.01) |
| *H05K 5/00* | (2006.01) |

(52) U.S. Cl.
CPC ............ *H05K 5/0017* (2013.01); *G06F 1/1626* (2013.01); *F16F 7/108* (2013.01); *F16F 7/1028* (2013.01)
USPC .... 361/679.21; 439/527; 345/174; 455/575.3

(58) Field of Classification Search
USPC ........... 439/76.1, 76.2, 441, 527; 361/679.21, 361/679.01, 679.58, 679.27, 679.3, 679.26, 361/679.29, 679.4, 679.48, 679.09, 679.02, 361/679.28, 679.11, 679.15, 679.54, 361/679.46, 679.23, 679.06, 679.08, 361/679.56; 345/87, 156, 660, 173, 174, 345/205, 207, 659, 102; 248/688, 176.3, 248/124.1; 312/327, 326, 319, 296, 223.1, 312/323
See application file for complete search history.

(56) References Cited

U.S. PATENT DOCUMENTS

| | | |
|---|---|---|
| 3,606,296 A | 9/1971 | Chassagne |
| 4,278,726 A | 7/1981 | Wieme |
| 4,849,580 A | 7/1989 | Reuter |
| 5,182,158 A | 1/1993 | Schaeffer |
| 5,349,893 A | 9/1994 | Dunn |
| 5,368,914 A | 11/1994 | Barrett |

(Continued)

FOREIGN PATENT DOCUMENTS

| | | |
|---|---|---|
| CN | 202444711 | 9/2012 |
| CN | 203119975 | 8/2013 |

(Continued)

*Primary Examiner* — Hung Duong
(74) *Attorney, Agent, or Firm* — Brownstein Hyatt Farber Schreck, LLP

(57) ABSTRACT

Apparatus, systems and methods for shock mounting glass for an electronic device are disclosed. The glass for the electronic device can provide an outer surface for at least a portion of a housing for the electronic device. In one embodiment, the shock mounting can provide a compliant interface between the glass and the electronic device housing. In another embodiment, the shock mounting can provide a mechanically actuated retractable. For example, an outer glass member for an electronic device housing can be referred to as cover glass, which is often provided at a front surface of the electronic device housing.

18 Claims, 10 Drawing Sheets

(56) References Cited

U.S. PATENT DOCUMENTS

| | | | |
|---|---|---|---|
| 5,426,562 A | 6/1995 | Morehouse et al. | |
| 5,587,854 A | 12/1996 | Sato et al. | |
| 5,606,341 A * | 2/1997 | Aguilera | 345/87 |
| 5,659,376 A | 8/1997 | Uehara et al. | |
| 5,666,261 A | 9/1997 | Aguilera | |
| 5,783,297 A | 7/1998 | Wise et al. | |
| 5,936,600 A | 8/1999 | Ohashi et al. | |
| 5,965,249 A | 10/1999 | Sutton et al. | |
| 5,982,617 A | 11/1999 | Haley et al. | |
| 6,154,360 A | 11/2000 | Kaczeus et al. | |
| 6,251,493 B1 | 6/2001 | Johnson et al. | |
| 6,262,888 B1 | 7/2001 | Siedow et al. | |
| 6,288,489 B1 | 9/2001 | Isohata et al. | |
| 6,324,054 B1 | 11/2001 | Chee et al. | |
| 6,373,702 B2 | 4/2002 | Oishi et al. | |
| 6,524,692 B1 | 2/2003 | Rosen | |
| 6,596,976 B2 | 7/2003 | Lin et al. | |
| 6,603,620 B1 | 8/2003 | Berding | |
| 6,627,818 B2 | 9/2003 | Kamel et al. | |
| 6,633,481 B2 | 10/2003 | Pavol | |
| 6,647,328 B2 | 11/2003 | Walker | |
| 6,664,491 B2 | 12/2003 | Yanai et al. | |
| 6,665,192 B2 | 12/2003 | Wimberger Friedl et al. | |
| 6,701,529 B1 | 3/2004 | Rhoades et al. | |
| 6,744,186 B2 | 6/2004 | Oishi et al. | |
| 6,809,916 B2 | 10/2004 | Nakata et al. | |
| 6,859,357 B2 | 2/2005 | Morimoto et al. | |
| 6,924,996 B2 | 8/2005 | Sugawara | |
| 6,968,954 B2 | 11/2005 | Hsieh | |
| 7,009,835 B2 | 3/2006 | Desai et al. | |
| 7,059,182 B1 | 6/2006 | Ragner | |
| 7,094,094 B2 | 8/2006 | Zahnen et al. | |
| 7,113,351 B2 | 9/2006 | Hovanky | |
| 7,133,281 B2 | 11/2006 | Bae | |
| 7,167,360 B2 | 1/2007 | Inoue et al. | |
| 7,259,357 B2 | 8/2007 | Walker | |
| 7,260,885 B2 | 8/2007 | Albrecht et al. | |
| 7,369,345 B1 | 5/2008 | Li et al. | |
| 7,373,863 B2 | 5/2008 | O'Banion et al. | |
| 7,382,567 B2 | 6/2008 | Liao et al. | |
| 7,393,575 B2 | 7/2008 | Boss | |
| 7,450,332 B2 | 11/2008 | Pasolini et al. | |
| 7,463,436 B2 | 12/2008 | Takahashi et al. | |
| 7,477,469 B2 | 1/2009 | Cook et al. | |
| 7,492,544 B2 | 2/2009 | Jeansonne et al. | |
| 7,532,478 B2 | 5/2009 | Jeong | |
| 7,554,798 B2 | 6/2009 | Tanokuchi et al. | |
| 7,568,942 B1 | 8/2009 | Lannon et al. | |
| 7,612,994 B2 | 11/2009 | Ulrich et al. | |
| 7,619,891 B2 | 11/2009 | Woo et al. | |
| 7,643,243 B2 | 1/2010 | Lee et al. | |
| 7,652,892 B2 | 1/2010 | Shiu et al. | |
| 7,660,107 B2 | 2/2010 | Leung | |
| 7,684,183 B2 | 3/2010 | Mori et al. | |
| 7,760,289 B2 | 7/2010 | Nakanishi et al. | |
| 7,817,373 B2 | 10/2010 | Choi et al. | |
| 7,839,051 B2 | 11/2010 | Klinghult | |
| 7,855,892 B2 | 12/2010 | Lin | |
| 8,075,981 B2 | 12/2011 | Pearce et al. | |
| 8,093,811 B2 | 1/2012 | Tanokuchi et al. | |
| 8,106,789 B2 | 1/2012 | Yang et al. | |
| 8,144,453 B2 * | 3/2012 | Brown et al. | 361/679.21 |
| 8,189,280 B2 | 5/2012 | Ollila et al. | |
| 8,190,015 B2 | 5/2012 | Li et al. | |
| 8,248,777 B2 | 8/2012 | Prest | |
| 8,289,689 B2 | 10/2012 | Chen et al. | |
| 8,289,715 B2 | 10/2012 | Takahara | |
| 8,297,601 B2 | 10/2012 | Vito et al. | |
| 8,305,744 B2 | 11/2012 | Shedletsky et al. | |
| 8,330,305 B2 | 12/2012 | Hart et al. | |
| 8,352,077 B2 | 1/2013 | Goswami et al. | |
| 8,411,432 B1 | 4/2013 | Zimlin et al. | |
| 8,446,475 B2 | 5/2013 | Topliss et al. | |
| 8,467,133 B2 | 6/2013 | Miller | |
| 8,564,424 B2 | 10/2013 | Evarts et al. | |
| 2003/0168790 A1 | 9/2003 | Larson | |
| 2005/0017396 A1 | 1/2005 | Pearce et al. | |
| 2006/0109581 A1 | 5/2006 | Lee et al. | |
| 2008/0024972 A1 | 1/2008 | Yamaguchi | |
| 2008/0091309 A1 | 4/2008 | Walker | |
| 2008/0192124 A1 | 8/2008 | Nagasaki | |
| 2009/0273480 A1 * | 11/2009 | Mittleman et al. | 340/604 |
| 2010/0149073 A1 | 6/2010 | Chaum et al. | |
| 2010/0162835 A1 | 7/2010 | Lee et al. | |
| 2010/0164152 A1 | 7/2010 | Li | |
| 2010/0272969 A1 | 10/2010 | Taylor | |
| 2011/0228460 A1 | 9/2011 | Kim et al. | |
| 2011/0257765 A1 | 10/2011 | Evans et al. | |
| 2011/0310500 A1 | 12/2011 | Osaka et al. | |
| 2012/0212484 A1 | 8/2012 | Haddick et al. | |
| 2012/0212499 A1 | 8/2012 | Haddick et al. | |
| 2013/0073095 A1 * | 3/2013 | King et al. | 700/279 |
| 2013/0077278 A1 | 3/2013 | Prest | |
| 2013/0100591 A1 | 4/2013 | Montevirgen et al. | |
| 2013/0127980 A1 | 5/2013 | Haddick et al. | |
| 2013/0257582 A1 | 10/2013 | Rothkopf et al. | |
| 2013/0278631 A1 | 10/2013 | Border et al. | |
| 2013/0285490 A1 | 10/2013 | Rothkopf et al. | |
| 2014/0066122 A1 | 3/2014 | Shukla et al. | |

FOREIGN PATENT DOCUMENTS

| | | |
|---|---|---|
| GB | 1133198 | 11/1968 |
| JP | 2008067160 | 3/2008 |
| JP | 2009104407 | 5/2009 |
| JP | 2011099758 | 5/2011 |
| WO | WO2010/135421 | 11/2010 |

* cited by examiner

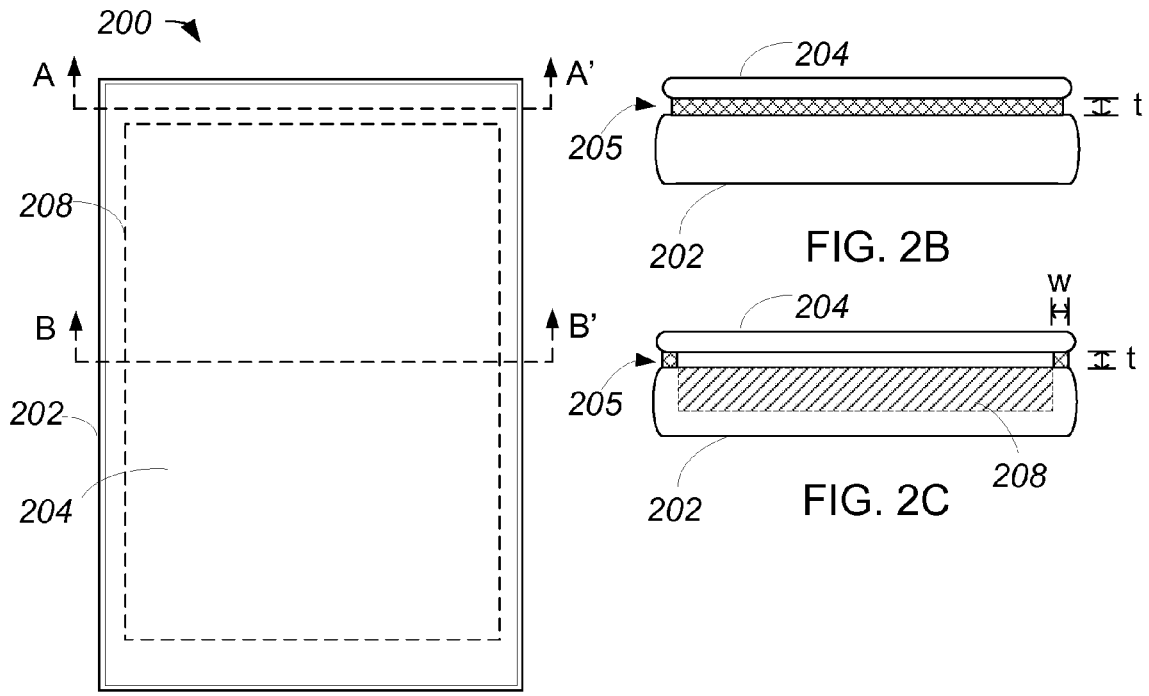
FIG. 2A
FIG. 2B
FIG. 2C
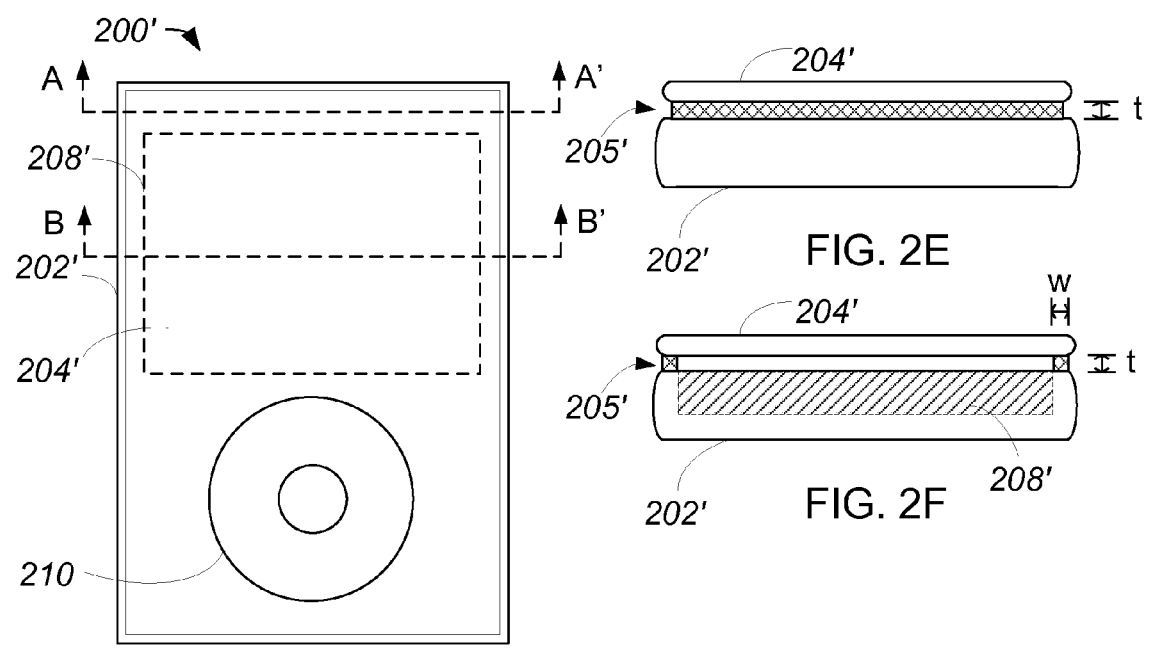
FIG. 2D
FIG. 2E
FIG. 2F

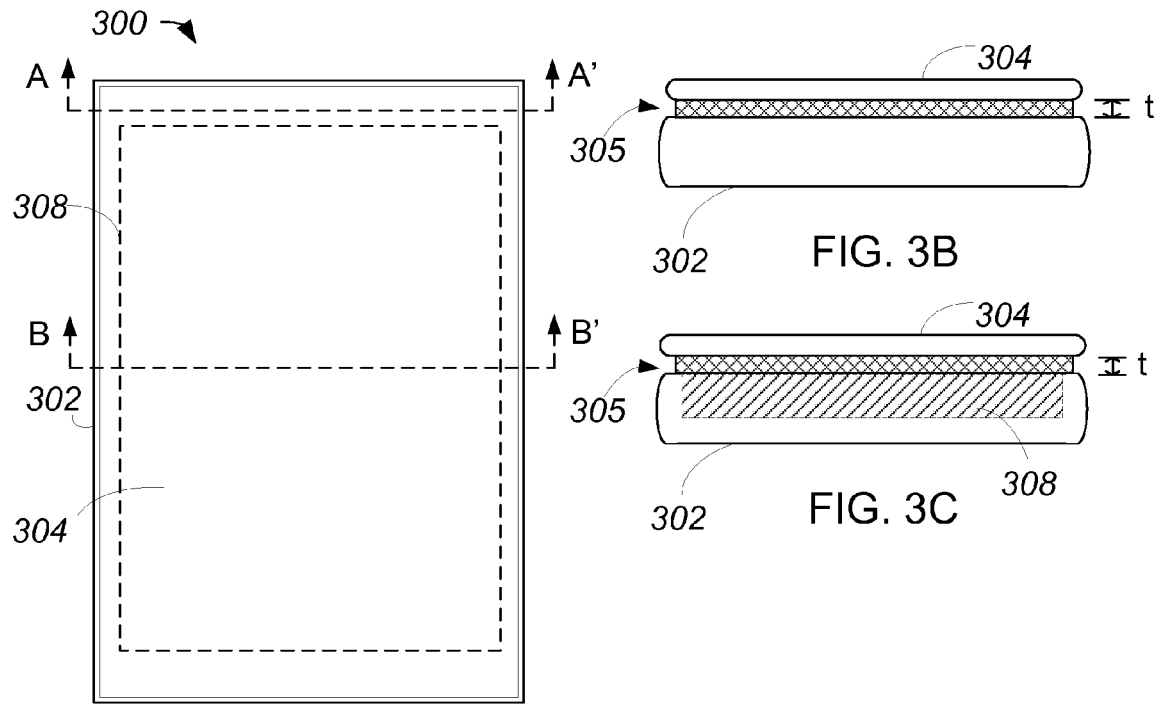
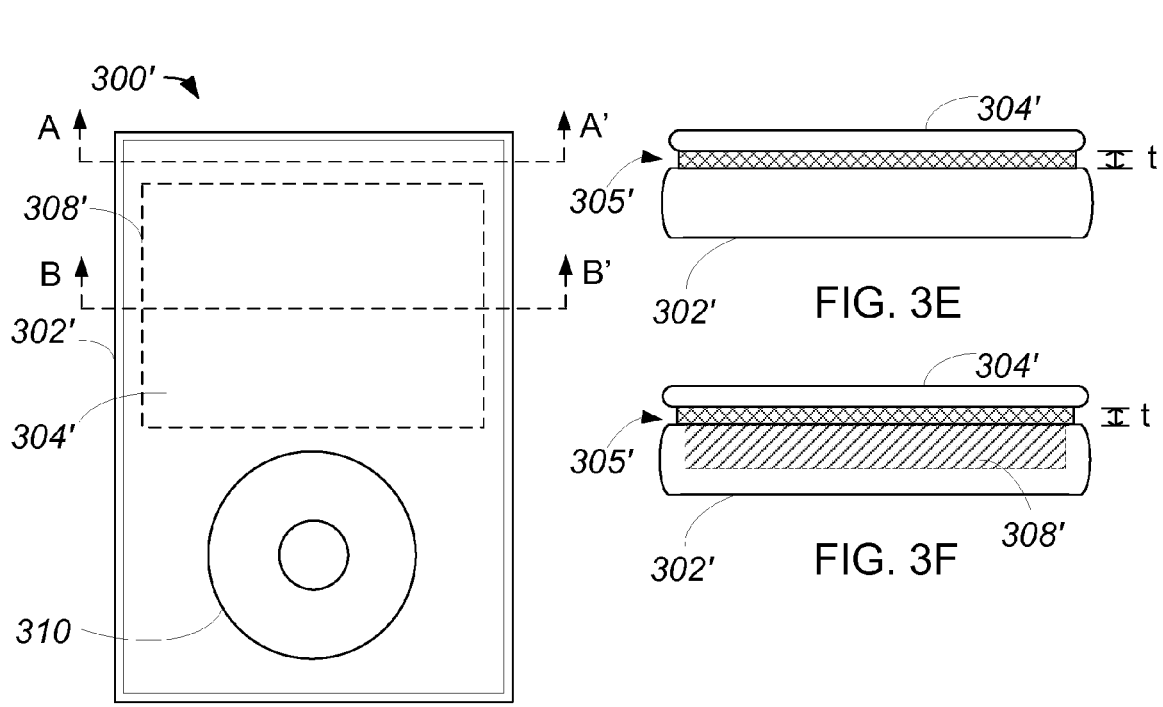

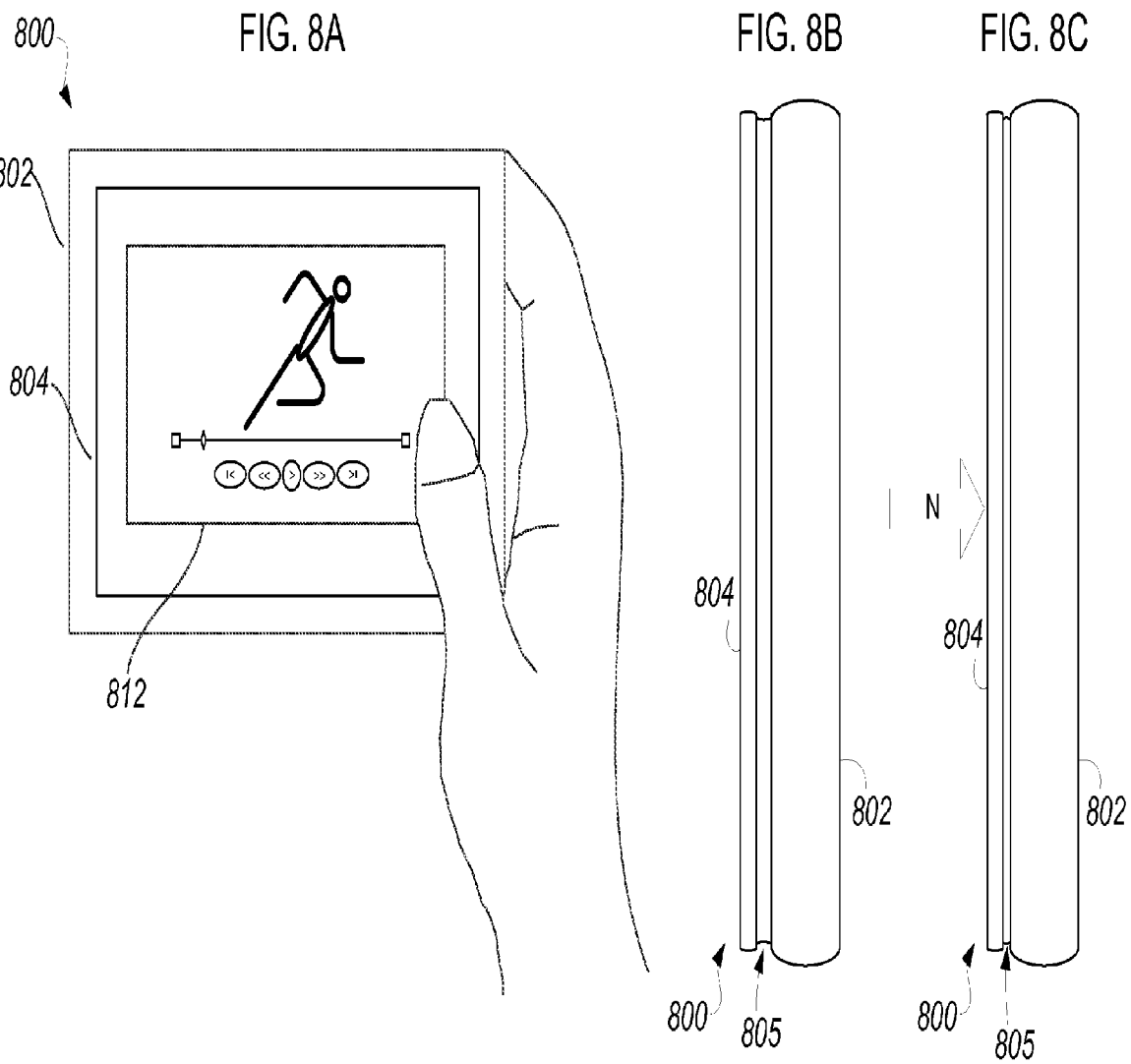

SHOCK MOUNTING COVER GLASS IN CONSUMER ELECTRONIC DEVICES

CROSS-REFERENCE TO RELATED APPLICATIONS

This application is a continuation patent application of U.S. patent application Ser. No. 12/780,715, filed May 14, 2010 and titled "Shock Mounting Cover Glass in Consumer Electronic Devices," the disclosure of which is hereby incorporated herein in its entirety.

BACKGROUND OF THE INVENTION

Conventionally, small form factor devices, such as handheld electronic devices, have a display arrangement that includes various layers. The various layers usually include at least a display technology layer, and may additionally include a sensing arrangement and/or a cover window disposed over the display technology layer. By way of example, the display technology layer may include or pertain to a Liquid Crystal Display (LCD) that includes a Liquid Crystal Module (LCM). The LCM generally includes an upper glass sheet and a lower glass sheet that sandwich a liquid crystal layer there between. The sensing arrangement may be a touch sensing arrangement such as those used to create a touch screen. For example, a capacitive sensing touch screen can include substantially transparent sensing points or nodes dispersed about a sheet of glass (or plastic). In addition, the cover window, which is typically designed as the outer protective barrier of the display arrangement.

The cover window, or glass cover, for a small form factor device can be made of plastic or glass. Plastic is durable but susceptible to being scratched. Glass is scratch resistant, but brittle. The rigid nature of glass makes it susceptible to cracking if subjected to significant forces. For example, users of handheld electronic devices occasionally drop their device onto a floor or other hard surface, and the resulting impact forces can cause the glass to crack. In general, the thicker the glass, the stronger it is. Unfortunately, however, with low profile handheld devices, the glass cover is often relatively thin, and tends to be susceptible to damage when the small form factor device is stressed as, for example, when dropped onto a floor. Here, the glass cover may crack or break as a result of being dropped onto the floor. As handheld electronic devices become thinner, the glass cover sheets used on the handheld electronic devices typically also becomes thinner and, thus, more susceptible to damage.

Thus, there is a continuing need for improved approaches for glass cover arrangements for electronic devices that are configured to avoid unnecessary damage.

SUMMARY OF THE INVENTION

Apparatus, systems and methods for shock mounting a cover glass for an electronic device are disclosed. The invention can be implemented in numerous ways, including as a method, system, device or apparatus (including graphical user interface). Several embodiments of the invention are discussed below.

In one embodiment, a method for assembling an electronic device can include at least providing a housing for an electronic device, and compliantly attaching a cover glass to at least a portion of one surface of the housing, whereby cover glass serves as an outer surface for the at least a portion of one surface of the housing.

In one embodiment, a consumer electronic device, can include a cover glass, and a shock mount disposed between the cover glass and a remaining mass of the electronic device. The shock mount is configured to isolate the cover glass from the remaining mass of the electronic device.

In another embodiment, a consumer electronic device can include a housing, a cover glass provided adjacent to at least one surface of the housing, and electrical components provided at least partially internal to the housing. The electrical components include at least a controller, a memory, a display, a sensor, and an actuator. At least the controller and the sensor are used to sense a drop event. The actuator can be coupled with the cover glass for withdrawing the cover glass at least partially into the housing in response to sensing the drop event, thereby protecting for the cover glass.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which:

FIGS. 2A-2F are simplified diagrams of an electronic device in accordance with another embodiment.

FIGS. 3A-3F are simplified diagrams of an electronic device in accordance with yet another embodiment.

FIGS. 8A-8C are simplified diagrams of an electronic device in accordance with still yet another embodiment.

DETAILED DESCRIPTION OF EMBODIMENTS OF THE INVENTION

Apparatus, systems and methods for shock mounting glass for an electronic device are disclosed. The glass for the electronic device can provide an outer surface for at least a portion of a housing for the electronic device. For example, an outer glass member for an electronic device housing can be referred to as cover glass, which is often provided at a front surface of the electronic device housing. Alternatively, as another example, the glass for the electronic device can be a glass member provide internal to an electronic device housing.

In one embodiment, the shock mounting can provide a compliant interface between the glass and the electronic device housing. In another embodiment, the shock mounting can provide a mechanically actuated retractable.

Since handheld electronic devices and portable electronic devices are potentially mobile, they can be subjected to various different impact events and stresses that stationary devices are not subjected to. The apparatus, systems and methods for shock mounting glass are well suited for cover glasses or displays (e.g., LCD displays) assembled in small form factor electronic devices such as handheld electronic devices (e.g., mobile phones, media players, personal digital assistants, remote controls, etc.). The apparatus, systems and methods for shock mounting glass can also be used for cover glasses or displays for relatively larger form factor electronic devices (e.g., portable computers, tablet computers, displays, monitors, televisions, etc.), which may also be portable.

Embodiments of the invention are discussed below with reference to FIGS. 1-9. However, those skilled in the art will readily appreciate that the detailed description given herein with respect to these figures is for explanatory purposes as the invention extends beyond these limited embodiments. The illustrations provided in these figures are not necessarily drawn to scale; instead, the illustrations are presented in a manner to facilitate presentation.

Figure 1A:
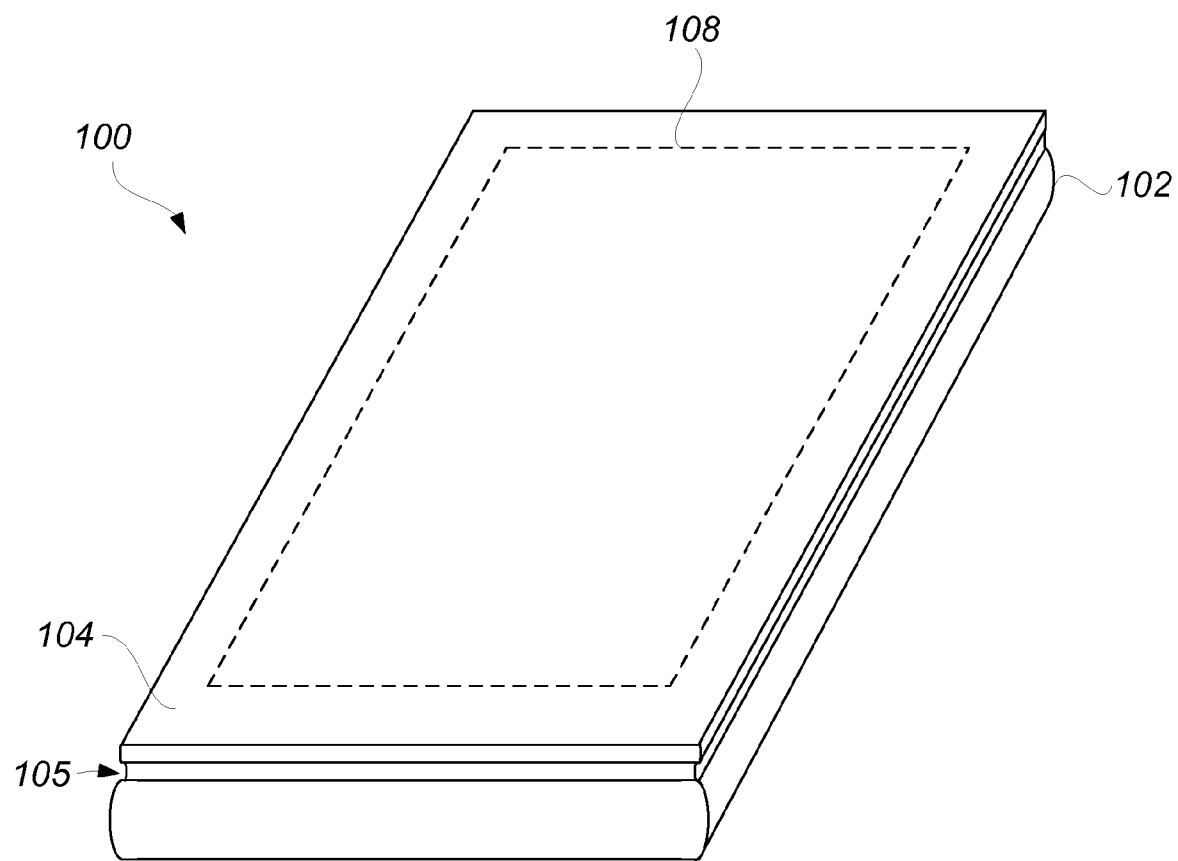
FIGS. 1A-1C are simplified diagrams of an electronic device in accordance with one embodiment.
Figure 1B:
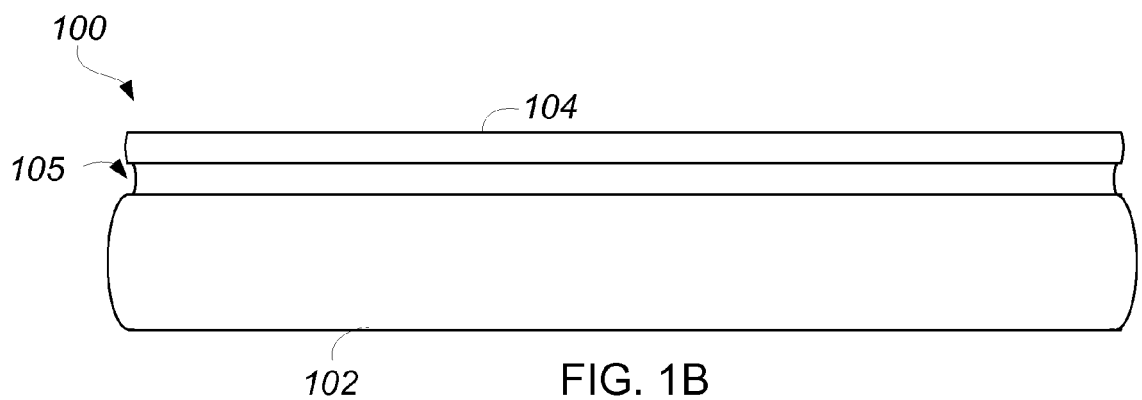
Figure 1C:
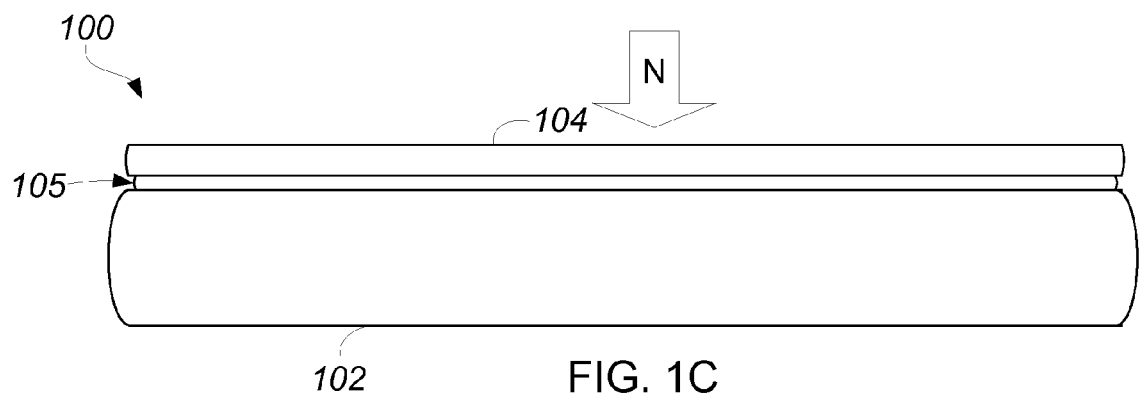

FIGS. 1A-1C are simplified diagrams of an electronic device 100 in accordance with one embodiment. The electronic device 100 may, for example, be embodied as portable or handheld electronic device having a thin form factor (or low profile). The electronic device 100 can, for example, correspond to a media player, a media storage device, a Portable Digital Assistant (PDA), a tablet PCs, a computer, a cellular phone, a smart phone, a GPS unit, a remote control, and the like.

As shown in perspective view in FIG. 1A, the electronic device 100 includes a housing 102 that serves as the outer surface for the electronic device 100. Electrical components (not shown) are disposed within the housing 102. The electrical components can include a controller (or processor), memory, battery, and a display. Additionally, the electronic device 100 has a cover glass 104. A tunable shock mount 105 can be disposed between the cover glass and the housing 102.

The cover glass 104 may be provided over a display area 108. The display area 108 can be disposed within the housing 102 of the electronic device 100. In this embodiment, the electronic device 100 includes a full view or substantially full view display area 108 that consumes a majority if not all of the front surface of the electronic device 100. The display area 108 may be embodied in a variety of ways. In one example, the display area 108 consists of at least a display such as a flat panel display and more particularly an LCD display.

The cover glass 104 serves as an external surface, i.e., top (or front) surface, for the electronic device 100. The cover glass 104 can be at least partially clear or highly translucent so that the display area 108 can be viewed through the cover glass 104. The cover glass 104 can also resists scratching and therefore provides a substantially scratch-resistance surface for the top surface of the housing 102 for the electronic device 100.

The display area 108 may alternatively or additionally include a touch sensing device positioned over a display screen. For example, in one embodiment, the display area 108 may include one or more glass layers having capacitive sensing points distributed thereon. Each of these components can be separate layers or they may be integrated into one or more stacks. In one embodiment, the cover glass 104 can act as the outer most layer of the display area 108.

The electronic device 100 may include a display region (e.g., the display area 108) that includes various layers. The various layers may include at least a display, and may additionally include a sensing arrangement disposed over the display. In some cases, the layers may be stacked and adjacent one another, and may even be laminated thereby forming a single unit. In other cases, at least some of the layers are spatially separated and not directly adjacent. For example, the sensing arrangement may be disposed on or over the display, or can be disposed above the display such that there is a gap there between. By way of example, the display may include a Liquid Crystal Display (LCD) that includes a Liquid Crystal Module (LCM). The LCM generally includes at least an upper glass sheet and a lower glass sheet that at least partially sandwich a liquid crystal layer there between. The sensing arrangement may be a touch sensing arrangement such as those used to create a touch screen.

For example, a capacitive sensing touch screen can include substantially transparent sensing points or nodes dispersed about cover glass. The cover glass can serve as the outer protective barrier for the display region. The cover glass is typically adjacent the display region but can also be integrated with the display regions, such as another layer (outer protective layer) therefor.

As shown in FIG. 1A, the cover glass 104 can extend across the entire top surface of the housing 102. In such a case, the edges of the cover glass 104 are aligned, or substantially aligned, with the sides of the housing 102. Due in part to such external exposure, the cover glass 104 can be damaged when the electronic device 100 is stressed as for example in a drop event.

As a result, the cover glass 104 can be is often not the strongest component of the electronic device 100 in terms of strength against bending and damage if dropped. By way of example, stress to the cover glass 104 can result in damage, such as cracks or breaks.

Given that the thickness of the cover glass 104 can be rather thin (i.e., less than a few millimeters), the cover glass 104 if not carefully arranged can be susceptible to cracking or breaking if a significant force is imposed thereon, such as by a drop event where the electronic device 100 is accidentally dropped. Therefore the cover glass 104 can be suitably arranged with the tunable shock mount 105, which can be tuned so as to limit susceptibility to damage.

The tunable shock mount 105 may be disposed between the cover glass 104 and a remaining mass of the electronic device. As particularly shown in sequential end views of the electronic device 100 before a shock event in FIG. 1B, and after a shock event in FIG. 1C, the tunable shock mount 105 can provide compression and dampening, so as to isolate the cover glass 104 from the remaining mass of the electronic device 100. The cover glass 104 has a substantially planar surface, and the tunable shock mount 105 is arranged so as to provide compression and dampening along a direction normal to the planar surface of the cover glass 104 (for illustrative purposes in FIG. 1C, the direction normal to the planar surface is shown by a notional arrow with the legend "N").

In response to such shock events, the cover glass can resonate. The cover glass can have a corresponding resonant frequency. Similarly, the remaining mass of the electronic device can have a corresponding resonant frequency. The tunable shock mount can be tuned to have a resonant frequency that is substantially lower than the resonant frequencies of the cover glass and the remaining mass of the electronic device. Additionally, the tunable shock mount can be tuned so as to be substantially critically damped.

Further measures can also be taken to limit damage to the cover glass 104. The glass material for the cover glass 104 can be selected from available glass that is stronger. For example, alumino silicate glass (e.g., DVTS from Corning) is one suitable choice for the glass material for the cover glass 104. Other examples of glass materials include, but are not limited to including, sodalime, borosilicate, and the like. Additionally, the edges of the cover glass pieces can be configured to correspond to a particular predetermined geometry. By machining the edges of the cover glass pieces to correspond to the particular predetermined geometry, the cover glass pieces can become stronger and thus less susceptible to damage.

Moreover, the cover glass pieces can be chemically treated for further strengthening. One suitable chemical treatment is to place the cover glass pieces in a chemical bath containing potassium (e.g., $KNO_3$) for a period of time (e.g., several hours) at an elevated temperature. The chemical treatment can desirably result in higher compression stresses at the surface of the cover glass pieces. The surface of the cover glass pieces includes the edges of the cover glass pieces. The higher compression stresses may be the result of K+ ions effectively replacing some Na+ ions at or near the surface of the cover glass.

As previously discussed, glass covers can be used as an outer surface of portions of a housing for electronic devices, e.g., handheld electronic devices. A handheld electronic device may, for example, function as a media player, phone, internet browser, email unit or some combination of two or more of such. A handheld electronic device generally includes a housing and a display area. With reference to FIGS. 2A-2F, and FIGS. 3A-3F different handheld electronic devices having cover glass (or glass windows) may be assembled. By way of example, the handheld electronic devices may correspond to an iPhone™ or iPod™ manufactured by Apple Inc. of Cupertino, Calif.

FIGS. 2A, 2B and 2C are a diagrammatic representation of an electronic device 200 according to one embodiment. FIG. 2A illustrates a top view for the electronic device 200. FIG. 2B illustrates a cross-sectional side view for the electronic device 200 with respect to reference line A-A' in FIG. 2A. FIG. 2C illustrates a cross-sectional side view for the electronic device 200 with respect to reference line B-B' in FIG. 2A.

The electronic device 200 can include a housing 202 that has a glass cover window 204 (cover glass) as a top surface. Tunable shock mount 205 can be disposed between the housing 202 and the cover window 204. The cover window 204 is primarily translucent so that a display assembly 208 is visible through the cover window 204. The display assembly 208 can, for example, be positioned adjacent the cover window 204. The display assembly 208 can, for example, be a LCD module. The housing 202 can also contain internal electrical components besides the display assembly, such as a controller (processor), memory, communications circuitry, etc.

By way of example, the display assembly 208 may include a Liquid Crystal Display (LCD) that includes a Liquid Crystal Module (LCM). In one embodiment, the cover window 204 is integrally formed with the LCM. Advantageously, the housing 202 need not include a bezel for the cover window 204. Instead, the cover window 204 can extend across the top surface of the housing 202 such that the edges of the cover window 204 are aligned (or substantially aligned) with the sides of the housing 202.

The cover window 204 may generally be arranged or embodied in a variety of ways. By way of example, the cover window 204 may be configured as a protective glass piece that is positioned over an underlying display such as a flat panel display (LCD) or touch screen display (LCD and a touch layer). Alternatively, the cover window 204 may effectively be integrated with a display, i.e., glass window may be formed as at least a portion of a display. Additionally, the cover window 204 may be substantially integrated with a touch sensing device such as a touch layer associated with a touch screen. In some cases, the cover window 204 can serve as the outer most layer of the display area.

As shown in top view in FIG. 2A and as shown in cross-sectional views in FIGS. 2B and 2C, the housing 202 of the electronic device has a front surface, a back surface and side surfaces. The tunable shock mount 205 can be disposed between the cover glass 204 and the front surface of the housing 202. The electrical components can be provided at least partially internal to the housing. The electrical components can include at least the controller, the memory, and the display assembly 208. The display assembly can be provided at or adjacent the front surface of the housing, wherein the cover glass 204 is provided at or over the front surface of the housing such that it is provided over the display assembly 208.

As shown in top view in FIG. 2A, the cover glass 204 can have a substantially planar surface, and an outer perimeter surrounding the substantially planar surface. As particularly shown in top view in FIG. 2A and in cross-sectional views in FIGS. 2B and 2C the tunable shock mount 205 can be disposed adjacent to the outer perimeter, between the cover glass and the front surface of the housing. As particular shown in cross section in FIG. 2C, a central aperture in the tunable shock mount 205 can provide an unobstructed view of the display assembly 208 through the cover glass 204.

A material of the tunable shock mount 205 can be selected, dimensioned and/or arranged in a pattern or patterns so as to provide for suitable tuning. A resonant frequency of the tunable shock mount 205 can be tuned so as to be substantially lower than a resonant frequency of the cover glass 204 and/or a resonant frequency of the remaining mass of the electronic device 200. The tunable shock mount 205 can be tuned so as to be substantially critically damped.

A material of the tunable shock mount 205 may include a polymer, a foam, a gel, a viscoelastic material, a shape memory material, an exothermic material, an optically transparent material, a silicone rubber material or other suitable material. Depending in part upon the material or materials selected for the tunable shock mount 205, and upon parameters such as compressive stiffness and/or dampening of such material or materials, dimensions of the tunable shock mount 205 such as a width dimension "w" and/or a thickness dimension "t" shown in cross-sectional views in FIGS. 2B and 2C may be selected so as to provide tuning.

FIGS. 2D, 2E and 2F are a diagrammatic representation of an electronic device 200' according to another embodiment, which is similar in many ways to the embodiment just discussed with respect to FIGS. 2A, 2B and 2C. Similar structures have similar reference numerals and dimension designations. FIG. 2D illustrates a top view for the electronic device 200'. FIG. 2E illustrates a cross-sectional side view for the electronic device 200' with respect to reference line A-A' in FIG. 2D. FIG. 2F illustrates a cross-sectional side view for the electronic device 200 with respect to reference line B-B' in FIG. 2D.

The electronic device 200' can include a housing 202' that has a glass cover window 204' (cover glass) as a top surface. Tunable shock mount 205' can be disposed between the housing 202' and the cover window 204'. As shown in top view in FIG. 2D, the cover glass 204' can have a substantially planar surface, and an outer perimeter surrounding the substantially planar surface. As particularly shown in top view in FIG. 2D and in cross-sectional views in FIGS. 2E and 2F the tunable shock mount 205 can be disposed adjacent to the outer perimeter, between the cover glass and the front surface of the housing. As particular shown in cross section in FIG. 2F, an aperture in the tunable shock mount 205' can provide an unobstructed view of the display assembly 208' through the cover glass 204'.

Depending in part upon the material or materials selected for the tunable shock mount 205', and upon parameters such as compressive stiffness and dampening of such material or materials, dimensions of the tunable shock mount 205' such as a width dimension "w" and/or a thickness dimension "t" shown in cross-sectional views in FIGS. 2E and 2F may be selected so as to provide tuning.

The cover window 204' is primarily translucent so that a display assembly 208' is visible through the cover window 204'. The display assembly 208' can, for example, be positioned adjacent the cover window 204'. The display assembly 208' can, for example, be a LCD module. The housing 202' can also contain internal electrical components besides the display assembly, such as a controller (processor), memory, communications circuitry, etc. By way of example, the display assembly 208' may include a Liquid Crystal Display (LCD) that includes a Liquid Crystal Module (LCM). In one embodiment, the cover window 204' is integrally formed with the LCM. Advantageously, the housing 202' need not include a bezel for the cover window 204'. Instead, the cover window 204' can extend across the top surface of the housing 202' such that the edges of the cover window 204' are aligned (or substantially aligned) with the sides of the housing 202'.

As a front surface of electronic device 200' also includes a click wheel control 210, the cover window 204' does not cover the entire front surface of electronic device 200'. The electronic device 200' essentially includes a partial display area that covers a portion of the front surface.

The cover window 204' may generally be arranged or embodied in a variety of ways. By way of example, the cover window 204' may be configured as a protective glass piece that is positioned over an underlying display such as a flat panel display (LCD) or touch screen display (LCD and a touch layer). Alternatively, the cover window 204' may effectively be integrated with a display, i.e., glass window may be formed as at least a portion of a display. Additionally, the cover window 204' may be substantially integrated with a touch sensing device such as a touch layer associated with a touch screen. In some cases, the cover window 204' can serve as the outer most layer of the display area.

FIGS. 3A-3F are simplified diagrams of an electronic device in accordance with yet another embodiment, which (except as shown and specifically discussed) is similar in many ways to the embodiments just discussed with respect to FIGS. 2A-2F. Similar structures have similar reference numerals.

Electronic device 300 (300') can include housing 302 (302') that has a cover glass/glass cover window 304 (304') as a top surface. The tunable shock mount 305 (305') can be disposed between the cover glass 304 (304') and a front surface of the housing 302 (302'). As shown in cross-sectional side views in FIGS. 3C and 3F, an optically transparent material having a thickness dimension "t" may be used in the tunable shock mount 305 (305'), so that the tunable shock mount 305 (305') may be interposed between a display assembly 308 (308') and the cover glass 304 (304') while still providing an unobstructed view of the display assembly 308 (308') through the cover glass 304 (304'). In particular, the optically transparent material of the tunable shock mount 305 (305') can extend over a central portion of a display area of the display assembly 308 (308').

As shown in FIGS. 3D-3F, since a front surface of electronic device 300' also includes a click wheel control 310, the cover window 304' does not cover an entire front surface of electronic device 300'. The electronic device 300' essentially includes a partial display area that covers a portion of the front surface.

FIGS. 4A-4H are simplified diagrams of electronic device end views in accordance with various additional embodiments, which are generally similar to embodiments already discussed, except for additional patterned arrangements of the tunable shock mount as shown in FIGS. 4A-4H. As shown using hatching to highlight different shock mount materials, the tunable shock mount can comprise a plurality of different materials each respectively having substantially different compressive stiffnesses. The tunable shock mount can be tuned to a plurality of frequencies based at least in part on the different compressive stiffnesses.

Further, the tunable shock mount can be tuned based at least in part on a patterned arrangement of the different materials. In particular, the cover glass can have a substantially planar surface, and the tunable shock mount may comprise a plurality of different materials disposed at locations adjacent to the planar surface of the cover glass, so that the tunable shock mount is tuned based at least in part on locations of the different materials.

Figure 4A:
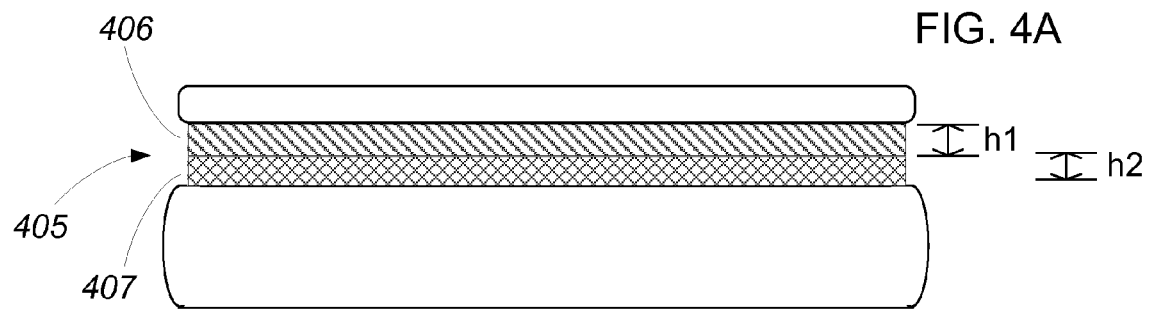
FIGS. 4A-4H are simplified diagrams of electronic device end views, in accordance with additional embodiments.

As shown in FIG. 4A, the tunable shock mount 405 may comprise a plurality of layers 406, 407 of different materials stacked along a direction normal to the planar surface of the cover glass. Each of the layers 406, 407 can have respective thickness dimensions h1, h2 extending along the direction normal to the planar surface of the cover glass. The tunable shock mount can be tuned based at least in part on the thickness dimensions h1, h2 of the layers.

As shown in remaining FIGS. 4B-4H the tunable shock mount may comprise a plurality of projections each extending along the direction normal to the planar surface of the cover glass. The tunable shock mount can be tuned based at least in part on a plurality of the projections. Further, the tunable shock mount can be tuned based at least in part on a patterned arrangement of the projections.

As shown in remaining FIGS. 4B-4H the projections can each having respective height dimensions extending along the direction normal to the planar surface of the cover glass. The tunable shock mount can be tuned based at least in part on the height dimensions of the projections.

Figure 4B:
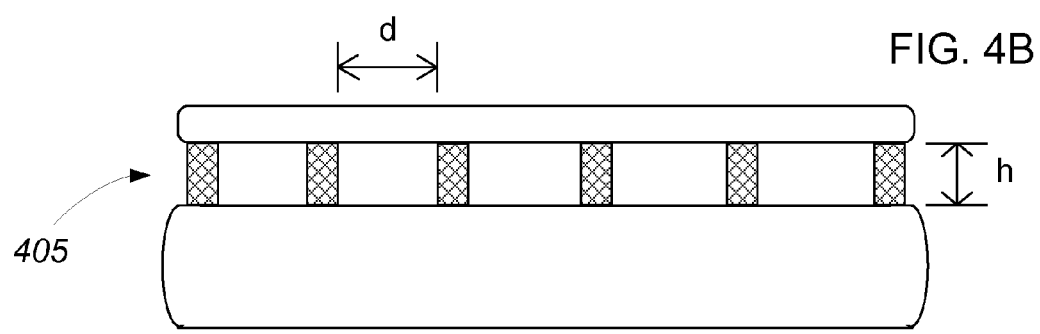

For example, as shown in FIG. 4B, the tunable shock mount 405 may comprise a spaced apart, patterned arrangement of projections each extending along the direction normal to the planar surface of the cover glass. The projections can be spaced apart from one another by a distance d. The projections can each have respective height dimensions h extending along the direction normal to the planar surface of the cover glass.

Figure 4C:
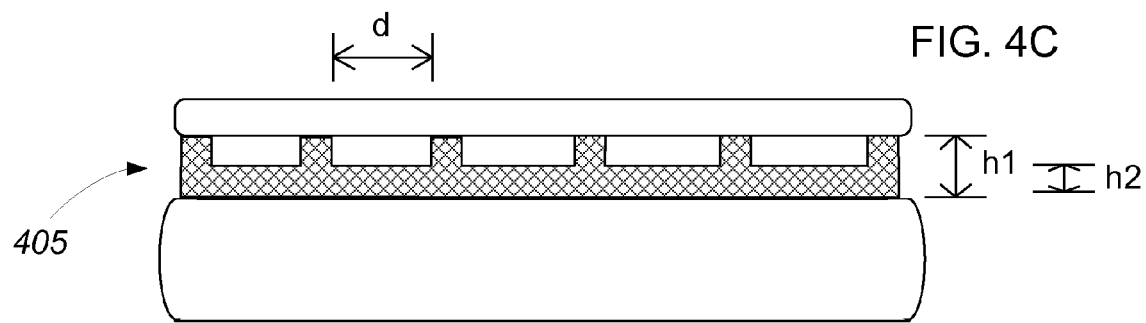

Similar to FIG. 4B, for the tunable shock mount 405 shown in FIG. 4C, the projections can likewise be spaced apart from one another a distance d in a patterned arrangement. However, in FIG. 4C the projections can each have respective height dimensions h1 extending along the direction normal to the planar surface of the cover glass, while the projections can be contiguous with a base layer having a thickness h2.

Figure 4D:
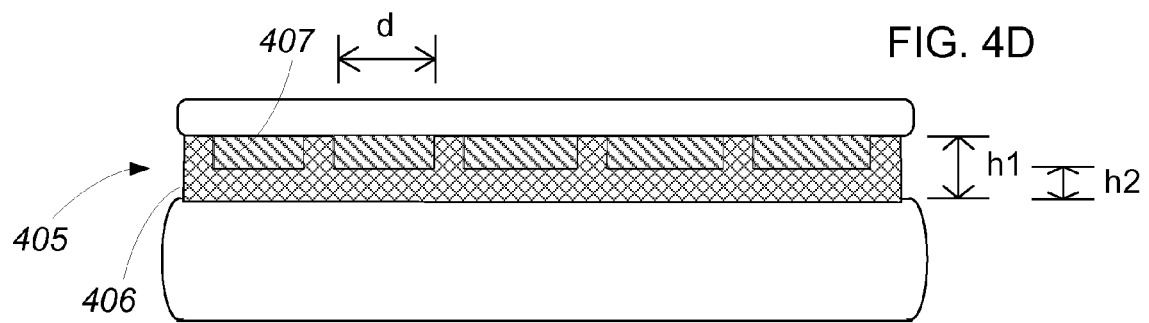

Similar to FIG. 4C, for the tunable shock mount 405 shown in FIG. 4D, the projections can likewise be spaced apart from one another a distance d in a patterned arrangement. The projections can likewise each have respective height dimensions h1 extending along the direction normal to the planar surface of the cover glass, while the projections can be contiguous with a base layer having a thickness h2. However, in FIG. 4D a first material is used for the projections contiguous with the base layer 406. A second material can fill gaps 407 between the spaced apart projections.

Figure 4E:
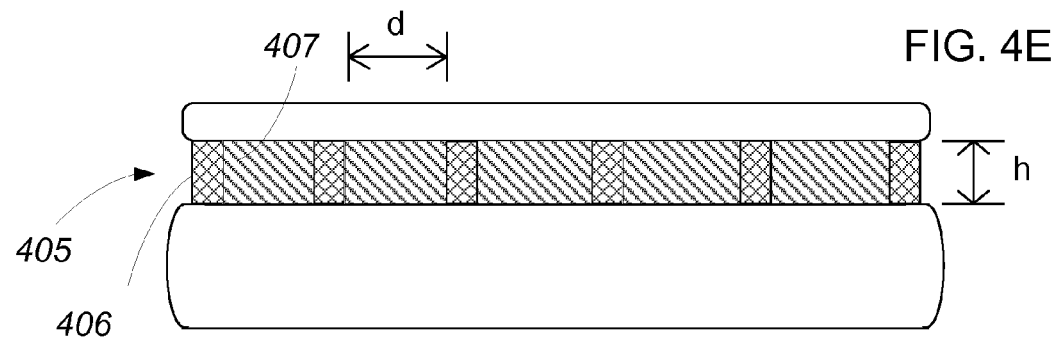

In the tunable shock mount 405 shown in FIG. 4E projections 406 of a first material can be spaced apart from one another a distance d in a patterned arrangement. The projections can each have respective height dimensions h extending along the direction normal to the planar surface of the cover glass. A second material can fill gaps 407 between the spaced apart projections.

Figure 4F:
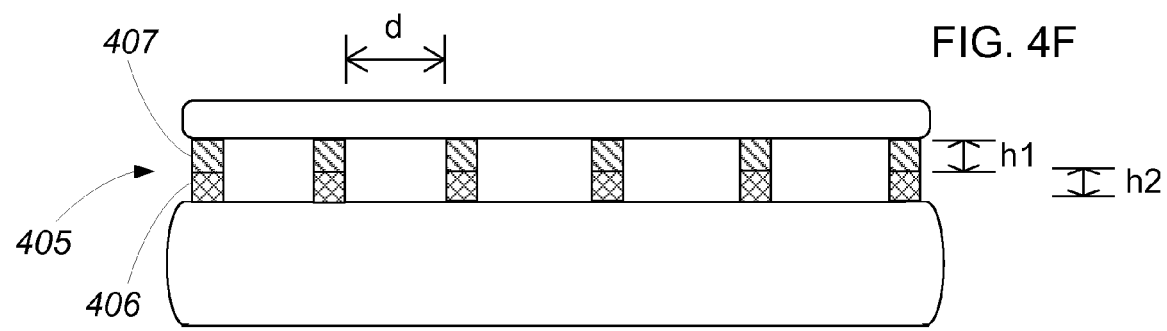

The tunable shock mount 405 of FIG. 4F shows stacked projections 406, 407 of different layered materials having thicknesses h1, h2. The stacked projections can be spaced apart from one another a distance d in a patterned arrangement.

Figure 4G:
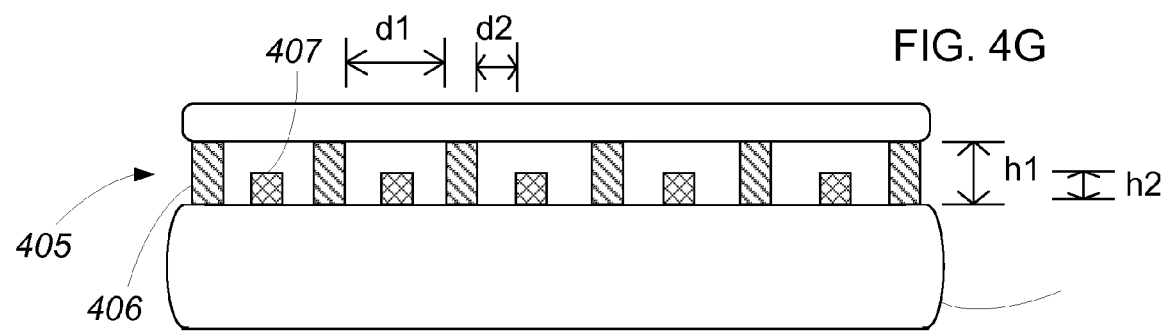
Figure 4H:
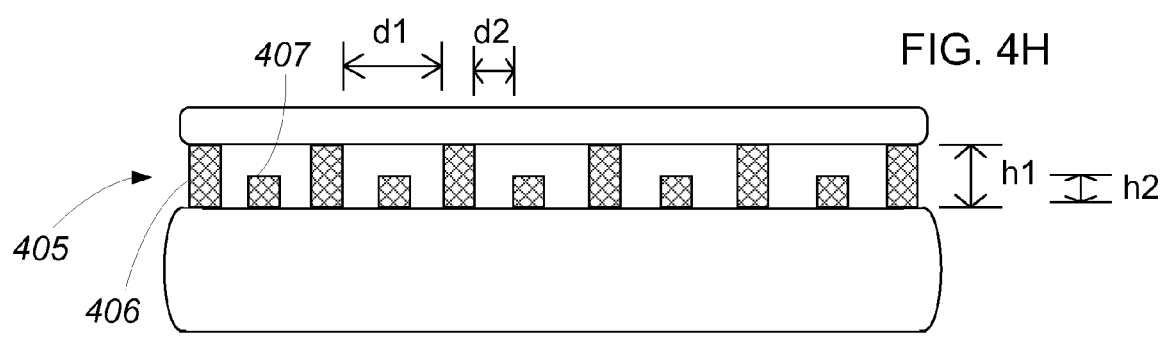

The tunable shock mount 405 of FIG. 4G shows primary and secondary projections 406, 407 of different materials having thicknesses h1, h2. The primary projections can be spaced apart from one another a distance d1, and the secondary projections can be spaced apart from the primary projections a distance d2, in a patterned arrangement. The tunable shock mount 405 of FIG. 4H is similar to what is shown in FIG. 4G, except in FIG. 4H the same material can be used for the primary and secondary projections 406, 407.

Figure 5:
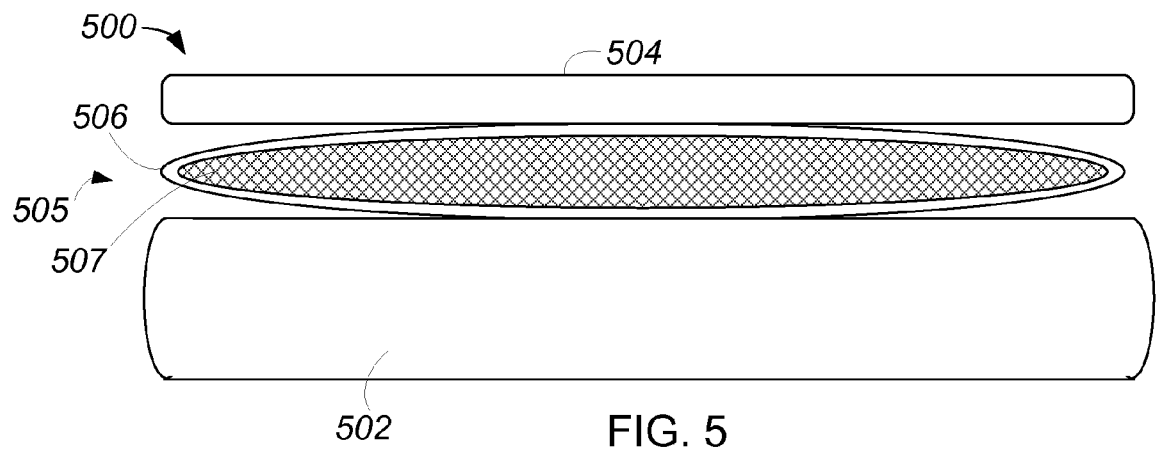
FIGS. 5 and 6 are simplified diagrams of an electronic device in accordance with more additional embodiments.
Figure 6:
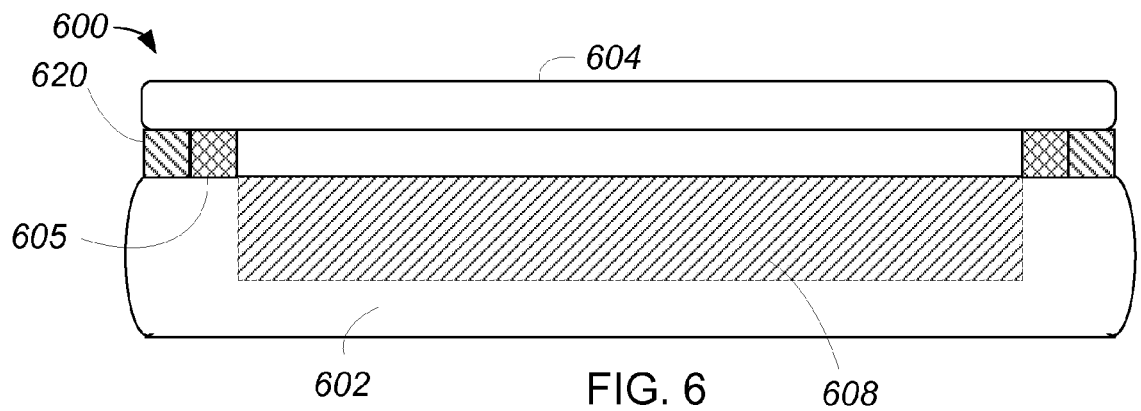

FIGS. 5 and 6 are simplified diagrams of an electronic device 500, 600 in accordance with additional embodiments. FIG. 5 shows a housing 502 and a cover glass 504 in cross sectional view having a tunable shock mount 505 disposed there between. The tunable shock mount 505 can comprise an inflatable bladder 506 filled with a fluid 507. Tuning can be done in various ways such as by selection of materials for the bladder 506 and fluid 507, and by varying an amount of inflation.

FIG. 6 shows an electronic device 600 in cross sectional view. A housing 602 and a cover glass 604 is shown having a tunable shock mount 605 disposed there between. The housing can have a front surface, a back surface and side surfaces. Electrical components can be provided at least partially internal to the housing. The electrical components can include a controller, a memory, and a display 608. The display can be provided at or adjacent the front surface of the housing, and the cover glass can be provided at or over the front surface of the housing such that it is provided over the display.

Electrical components can be damaged by water. Accordingly, in one embodiment, a water seal 620 can be disposed between the cover glass and the front surface of the housing, which can help to protect the electrical components disposed within the housing from water damage. In FIG. 6, for illustrative purposes, the water seal 620 is shown as adjacent to the tunable shock mount 605. However, is should be understood that the water seal 620 and tunable shock mount 605 can be provided in various arrangements. For example, at least one material may be selected to provide the water seal 620 as well as the compression and dampening of the tunable shock mount 605. Alternatively, a material of the water seal 620 may combined with a compressive/dampening material of the tunable shock mount 605.

Figure 7A:
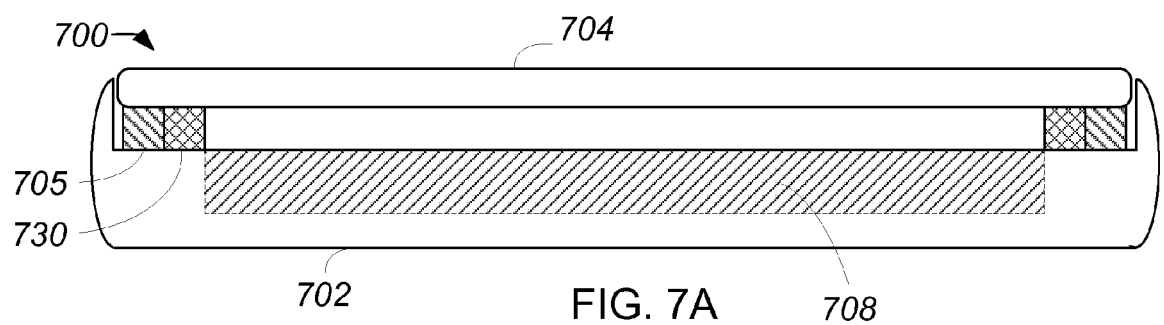
FIGS. 7A-7B are simplified diagrams of an electronic device in accordance with still another embodiment.
Figure 7B:
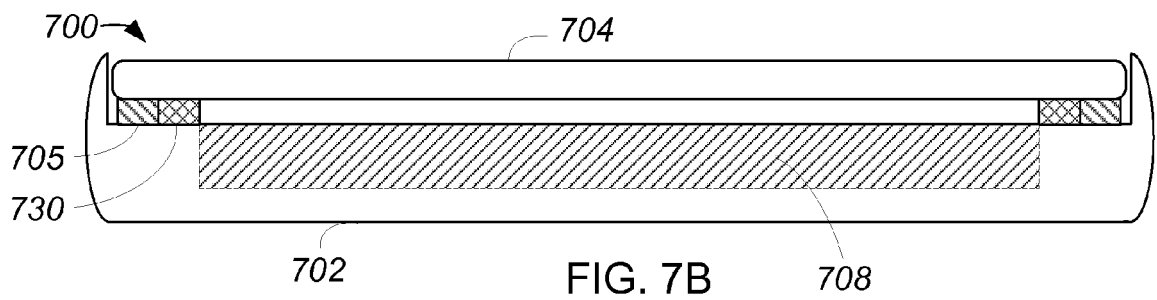

FIGS. 7A-7B are simplified diagrams of an electronic device 700 in accordance with still another embodiment. FIGS. 7A-7B show a housing 702 and a cover glass 704 and a tunable shock mount 705 in cross sectional view. Electrical components can be provided at least partially internal to the housing. The electrical components can include a controller, a memory, and a display, and can further include a sensor 608 for sensing freefall of a drop event.

As illustrated in sequential views, before the drop event in FIG. 7A and during freefall of the drop event in FIG. 7B, at least one actuator 730 can be coupled with the cover glass 704 for withdrawing the cover glass 704 at least partially into the housing 702 in response to s shock event (e.g., sensing freefall of the drop event), so as to provide protection for the cover glass 704. As particularly shown in FIG. 7B, the cover glass 704 can be withdrawn by the at least one actuator 730 so as to be sub-flush with the housing, so that structure of the housing can protect the cover glass 704 from subsequent impact and shock, resulting from the shock event.

Actuators such as solenoid actuators, or piezoelectric actuators employing a piezoelectric material, can be used to implement the at least one actuator 730. Such actuators can also be used as haptic actuators for generating a haptic event using the cover glass.

FIGS. 8A-8C are simplified diagrams of an electronic device 800 in accordance with still yet another embodiment. The electronic device can include a sensor for sensing a user movement of a cover glass. For example, the piezoelectric material just discussed can be likewise arranged between a housing 802 and the cover glass 804, for sensing compliant movement of the cover glass 804, as a user's hand squeezes the cover glass 804 against the housing 802 (as shown in the figures.)

FIG. 8A illustrates a top view that shows a display of a user interface 812, for displaying a user selectable item, and for selecting the user selectable item in response to sensing the user movement of the cover glass. In the example shown in FIG. 8A, the user interface 812 is a video player interface, and the user selectable item is a control to begin playing (or begin pausing) the video player.

FIGS. 8A and 8B show sequential end views, before the cover glass movement in FIG. 8B and after the cover glass movement in FIG. 8C. The user's movement of the cover glass 804 can be along a direction normal to a planar surface of the cover glass 804 (for illustrative purposes in FIG. 8C, the direction normal to the planar surface is shown by a notional arrow with the legend "N"). FIG. 8C shows compression of the tunable shock mount 805, as the user's hand squeezes the cover glass 804 against the housing 802.

Figure 9:
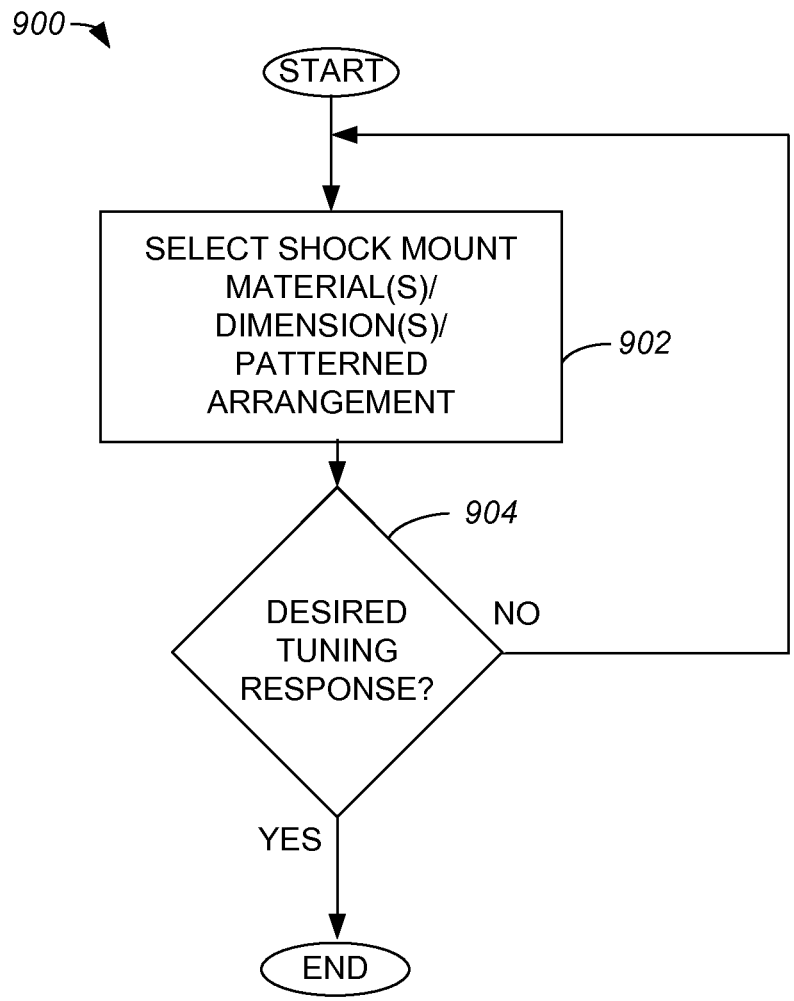
FIG. 9 is a flow diagram illustrating a tuning process according to one embodiment.

FIG. 9 is a flow diagram illustrating a tuning process 900 of one embodiment. The tuning process may begin with selecting 902 one or more materials for a tunable shock mount. The tunable shock mount may comprise a plurality of different materials each respectively having substantially different compressive stiffnesses. The tuning may comprise selecting the materials for tuning to a plurality of frequencies based at least in part on the different compressive stiffnesses. Similarly, the tuning may comprise selecting 902 one or more dimensions of the shock mount.

Further, the tuning may comprise patterning an arrangement of the shock mount, for example, patterning an arrangement of a plurality of materials of the shock mount. The cover glass can have a substantially planar surface, the tunable shock mount may comprise a plurality of projections each extending along a direction normal to the planar surface of the cover glass, and the tuning may comprise patterning an arrangement of the projections.

The tuning process 900 may continue with a decision 904 that determines whether the tunable shock mount has a desired tuning response. The decision 904 can, for example, be made using finite element modeling and simulation such as ANSYS™ computer based engineering simulation software. The decision 904 can also be made using physical assembly and shock testing methods.

Accordingly. various drop scenarios of the electronic device can be performed. Differing impacts of the electronic device result in differing shocks exciting differing vibrational modes and frequencies, which in turn result in differing types and degrees of damage to the cover glass. Simulated or physical testing can particularly focus on those drop scenarios that are most common, and/or those drop scenarios that cause significant damage to the cover glass.

The decision 904 can determine whether the shock mount has a desired resonant frequency and/or dampening for isolating the cover glass from the remaining mass of the electronic device. The shock mount can be substantially critically damped. The cover glass can have a resonant frequency, and the tunable shock mount can have a resonant frequency that is substantially lower than the resonant frequency of the cover glass. Similarly, the remaining mass of the electronic device can have a resonant frequency, and the tunable shock mount can have a resonant frequency that is substantially lower than the resonant frequency of the remaining mass of the electronic device.

When the decision 904 determines that the tunable shock mount does not have the desired tuning response, then the tuning process 900 returns to selecting dimensions and/or patterned arrangement and/or materials for the tunable shock mount. When the decision 904 determines that the tunable shock mount has the desired tuning response, the tuning process 900 can then end.

In one embodiment, the glass being compliantly mounted, e.g., via a shock mount, to an electronic device housing need not be an exterior surface for the electronic device housing. For example, the glass can pertain to an inner member such as a display device assembly (e.g., LCD assemble glass member).

In one embodiment, the size of the glass cover depends on the size of the associated electronic device. For example, with handheld electronic devices, the glass cover is often not more than five (5) inches diagonal. As another example, for portable electronic devices, such as smaller portable computers or tablet computers, the glass cover is often between four (4) to twelve (12) inches diagonal. As still another example, for portable electronic devices, such as full size portable computers, displays or monitors, the glass cover is often between ten (10) to twenty (20) inches diagonal or even larger.

However, it should be appreciated that with larger the screen sizes, the thickness of the glass layers may need to be greater. The thickness of the glass layers may need to be increased to maintain planarity of the larger glass layers. While the displays can still remain relatively thin, the minimum thickness can increase with increasing screen size. For example, the minimum thickness of the glass cover can correspond to about 0.4 mm for small handheld electronic devices, about 0.6 mm for smaller portable computers or tablet computers, about 1.0 mm or more for full size portable computers, displays or monitors, again depending on the size of the screen. The thickness of the glass cover depends on the application and/or the size of electronic device. While the current trend is to accommodate thinner and thinner devices, some examples for thicknesses of the glass cover can correspond to about 1 mm for small handheld electronic devices, about 2 mm for smaller portable computers or tablet computers, about 3 mm or more for full size portable computers, displays or monitors, again depending on the size of the screen.

The advantages of the invention are numerous. Different aspects, embodiments or implementations may yield one or more of the following advantages. One advantage of the invention is that cover glass can be protected from damage that would otherwise result from a drop event. For example, shock mounting can provide a compliant interface between the cover glass and an electronic device housing. In another example, the shock mounting can provide a mechanically actuated retractable. Another advantage is that electronics disposed within a housing can be protected from water damage by using a water seal. Another advantage is a user interface can employ user movement of a cover glass for providing user input.

Numerous specific details are set forth in order to provide a thorough understanding of the present invention. However, it will become obvious to those skilled in the art that the invention may be practiced without these specific details. The description and representation herein are the common meanings used by those experienced or skilled in the art to most effectively convey the substance of their work to others skilled in the art. In other instances, well-known methods, procedures, components, and circuitry have not been described in detail to avoid unnecessarily obscuring aspects of the present invention.

In the foregoing description, reference to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A consumer electronic device, comprising:
a housing;
a display surface coupled to the housing; and
a sensor operatively coupled to the display surface, the sensor configured to sense movement of the display surface relative to the housing; and
a processor operatively connected to the sensor and configured to accept an output of the sensor as an input to the consumer electronic device.

2. The consumer electronic device of claim 1, wherein the sensor comprises a piezoelectric material arranged between the housing and the display surface.

3. The consumer electronic device of claim 1, wherein the movement of the display surface is in a normal direction to a planar surface of the display surface.

4. The consumer electronic device of claim 1, wherein the display is operative to change a display element shown thereon, in response to the input.

5. The consumer electronic device of claim 4, wherein the electronic device is hand-held.

6. The consumer electronic device of claim 1, further comprising a tunable shock mount coupled between the display surface and the housing.

7. The consumer electronic device of claim 6, wherein the shock mount is arranged so as to provide compression along a direction normal to the planar surface of the display surface.

8. The consumer electronic device of claim 1, further comprising an actuator coupled with the display surface for withdrawing the display surface at least partially into the housing.

9. The consumer electronic device of claim 8, wherein the actuator comprises a solenoid.

10. The consumer electronic device of claim 8, wherein the actuator comprises a piezoelectric material.

11. The consumer electronic device of claim 1, wherein at least a portion of the display is visible external to the device.

12. The consumer electronic device of claim 1, wherein the display surface comprises a cover glass.

13. A method for assembling an electronic device, the method comprising:
provided a housing;
attaching a display surface to the housing; and
coupling a sensor operatively to the display surface, the sensor configured to sense movement of the display surface relative to the housing; and
connecting a processor operatively to the sensor, the processor being configured to accept an output of the sensor as an input to the consumer electronic device.

14. The method of claim 13, wherein the sensor comprises a piezoelectric material arranged between the housing and the display surface.

15. The method of claim 13, further comprising coupling a display of a user interface within the display surface.

16. The method of claim 13, further comprising coupling a tunable shock mount between the display surface and the housing.

17. The method of claim 16, the step of coupling a tunable shock mount comprising arranging the shock mount so as to provide compression along a direction normal to the planar surface of the display surface.

18. The method of claim 13, further comprising coupling an actuator to the display surface, the actuator operative to withdraw the display surface at least partially into the housing.

* * * * *